(12) United States Patent  
Huibers

(10) Patent No.: US 7,002,727 B2
(45) Date of Patent: Feb. 21, 2006

(54) OPTICAL MATERIALS IN PACKAGING MICROMIRROR DEVICES

(75) Inventor: Andrew G. Huibers, Palo Alto, CA (US)

(73) Assignee: Reflectivity, Inc., Sunnyvale, CA (US)

( * ) Notice: Subject to any disclaimer, the term of this patent is extended or adjusted under 35 U.S.C. 154(b) by 0 days.

(21) Appl. No.: 10/404,221

(22) Filed: Mar. 31, 2003

(65) Prior Publication Data

US 2004/0190112 A1    Sep. 30, 2004

(51) Int. Cl.
*G02B 26/00*    (2006.01)

(52) U.S. Cl. .............. 359/291; 359/290; 359/295; 359/297; 359/302

(58) Field of Classification Search ........... 359/290, 359/291, 295, 297, 302, 254, 247, 252, 267; 222/214, 602, 614
See application file for complete search history.

(56) References Cited

U.S. PATENT DOCUMENTS

| 5,483,254 | A  | * | 1/1996  | Powell ..................... 345/87 |
| 6,346,717 | B1 | * | 2/2002  | Kawata .................... 257/72 |
| 6,827,250 | B1 | * | 12/2004 | Uhland et al. ........... 228/110.1 |
| 6,843,936 | B1 | * | 1/2005  | Jacobs ..................... 252/194 |
| 6,844,959 | B1 | * | 1/2005  | Huibers et al. ............ 359/297 |
| 2002/0180944 | A1 | * | 12/2002 | Fujii et al. ................. 355/70 |
| 2003/0202264 | A1 | * | 10/2003 | Weber et al. .............. 359/877 |
| 2004/0008402 | A1 | * | 1/2004  | Patel et al. ............... 359/291 |
| 2004/0012838 | A1 | * | 1/2004  | Huibers .................... 359/291 |
| 2004/0142544 | A1 | * | 7/2004  | Kimura et al. ............. 438/486 |

* cited by examiner

*Primary Examiner*—Ricky L. Mack
*Assistant Examiner*—Brandi Thomas
(74) *Attorney, Agent, or Firm*—Gregory R. Muir

(57) ABSTRACT

A method for packaging micromirror array devices is disclosed herein. The method enhances illumination on micromirror array devices by applying a selected optical material between a package lid and glass substrate of the micromirror array device, the selected optical material having a refraction index that matches the refraction indices of the package lid and the glass substrate.

25 Claims, 5 Drawing Sheets

OPTICAL MATERIALS IN PACKAGING MICROMIRROR DEVICES

TECHNICAL FIELD OF THE INVENTION

The present invention is generally related to the art of packaging microelectromechanical devices, and more particularly, to packaging micromirror devices using optical materials for enhancing illumination on the micromirror arrays.

BACKGROUND OF THE INVENTION

A spatial light modulator (SLM) is a transducer that modulates incident light in a spatial pattern that corresponds to an optical or electrical input. A type of SLM is the SLM based on microelectromechanical systems (MEMS). A typical MEMS-based SLM comprises a micromirror array device that further consists of an array of micromirrors mounted on movable elements. Each individual micromirror can be independently deflected by an electrostatic force. Reflection of a beam of incident light impinging a micromirror can then be controlled, for example by deflecting the micromirror through changing the electrostatic force applied to the micromirror. MEMS-based SLMs have experienced significant developments and been innovatively implemented in many applications, one of which is the use in digital display systems. In a display application, each micromirror is associated with a pixel of a displayed image. To produce a bright pixel, the state of the micromirror associated with the pixel is set in such a way that the reflected light from the micromirror is directed onto a target for viewing. To produce a dark pixel, the status of the micromirror is tuned such that the reflected light from the micromirror is directed away from the display target. In order to display a black-and-white image, the micromirror array is illuminated by a beam of light. By coordinating the reflective status of the micromirrors based on the brightness of the pixels of the desired image, the collective effect of all reflected light from individual micromirrors is the generation of the desired image. Gray-scale and colored-images can also be displayed using the micromirror array, which will not be discussed in detail.

The micromirror is a delicate device. Its performance can be significantly degraded by, for example, moistures or other particles attached to the micromirror. For this and other reasons, micromirror array devices need to be packaged after fabrication. Regardless of the differences of different packaging methods currently developed, a glass lid that is transparent to visible light is used as a window allowing incident light illuminating the micromirrors of the SLM. An air gap, however, is unavoidably formed between the glass lid and the micromirror array device. The air gap reflects incident light and thus, reduces the illumination on the micromirror array. As a consequence, the overall performance quality of the MEMS-based SLM is reduced.

Therefore, a method and an apparatus are needed for packaging micromirror array devices that reduce reflection and increase the illuminations on the micromirror devices.

SUMMARY OF THE INVENTION

In view of the forgoing, the present invention provides a method for packaging micromirror array devices using selected optical materials. According to an embodiment of the invention, a packaging device is disclosed. The package comprises: a package with a package lid that is transmissive to Ultra-violet light or visible light; a micromirror array device placed within the package, wherein the micromirror array device further comprises a glass or quartz substrate that is transmissive to visible light; and a light-transmissive optical material that fills the space between the package lid and the glass substrate, wherein the optical material is in liquid or solid state.

According to another embodiment of the invention, a method is disclosed herein. The method comprises: providing a micromirror array device that comprises a glass or quartz substrate and a number of micromirrors; attaching the micromirror array device to a packaging substrate of a package; providing a packaging lid; filling a light-transmissive optical material in the space between the glass substrate of the micromirror array device and the packaging lid, wherein the optical material is in liquid or solid state; and bonding the packaging lid and the packaging substrate.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE INVENTION

Turning to the drawings, the present invention is illustrated as being implemented in a suitable packaging process for micromirror array devices. The following description is based on embodiments of the invention and should not be interpreted as limitations of the invention with regard to alternative embodiments that are not explicitly described herein.

Figure 1:
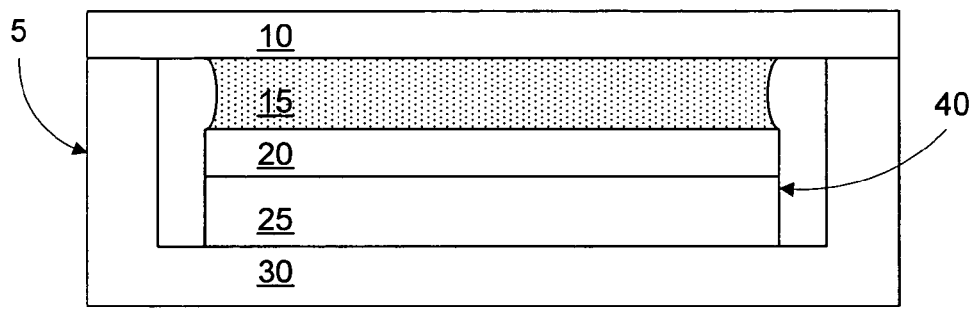
FIG. 1 is a diagram schematically illustrating packaged micromirror array device according to an embodiment of the invention.

Referring to FIG. 1, micromirror array device 40 comprises glass substrate 20, semiconductor substrate 25 and a plurality of micromirrors for modulating incident light. Depending upon specific design, the plurality of micromirrors can be formed on the glass substrate or the semiconductor substrate, as shown respectively in FIG. 2a and FIG. 2b. Though the methods, materials and mirror structures in FIG. 2a and FIG. 2b can be very different, the package needs, including the need to reduce reflection, can be similar.

Figure 2A:
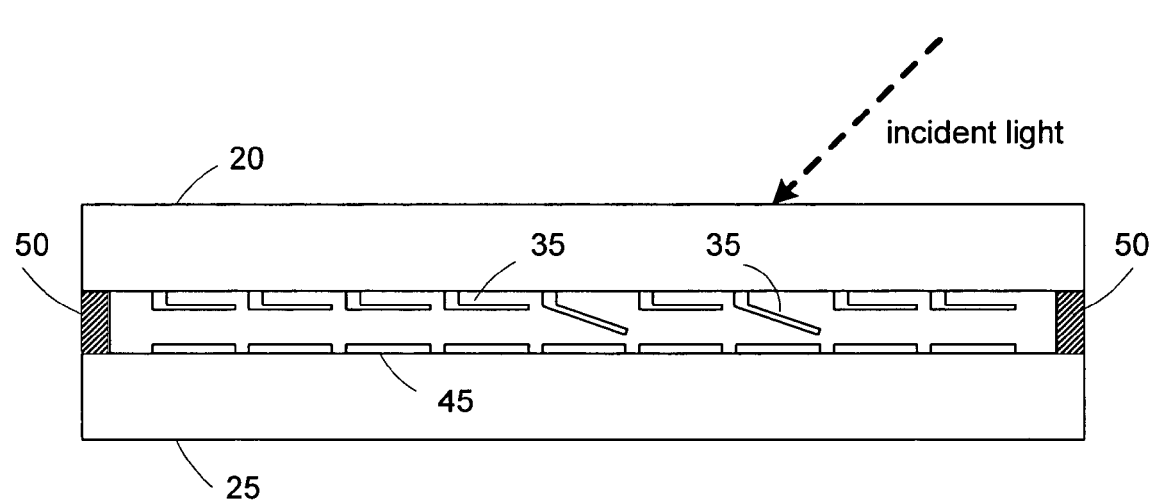
FIG. 2a is a cross-sectional view of a micromirror array device in FIG. 1.

Specifically, referring to FIG. 2a, the micromirrors (e.g. micromirror 35) are formed on glass substrate 20, such as 1737F, quartz, Pyrex™ or sapphire. And semiconductor substrate 25 (e.g. standard silicon semiconductor substrate) is formed thereon a plurality of electrodes (e.g. electrode 45) and circuitry (not shown). Semiconductor substrate 25 is placed proximate to glass substrate such that the electrodes and circuitry can electrostatically control the micromirrors. The glass substrate and the semiconductor substrate can be bonded together through adhesive spacer 50 for fixing the distance between the glass substrate and the semiconductor substrate. Alternatively, glass substrate 20 and semiconductor substrate 25 can be hermetically sealed through spacer 50, and/or other suitable materials and structures, which will not be discussed herein.

Incident light (e.g. white light) from the left top transmits through the glass substrate and illuminates the micromirrors. Under the control of the electrodes and circuitry, micromirrors reflect the incident light either onto or away from a display target so as to generating images on the display target.

Figure 2B:
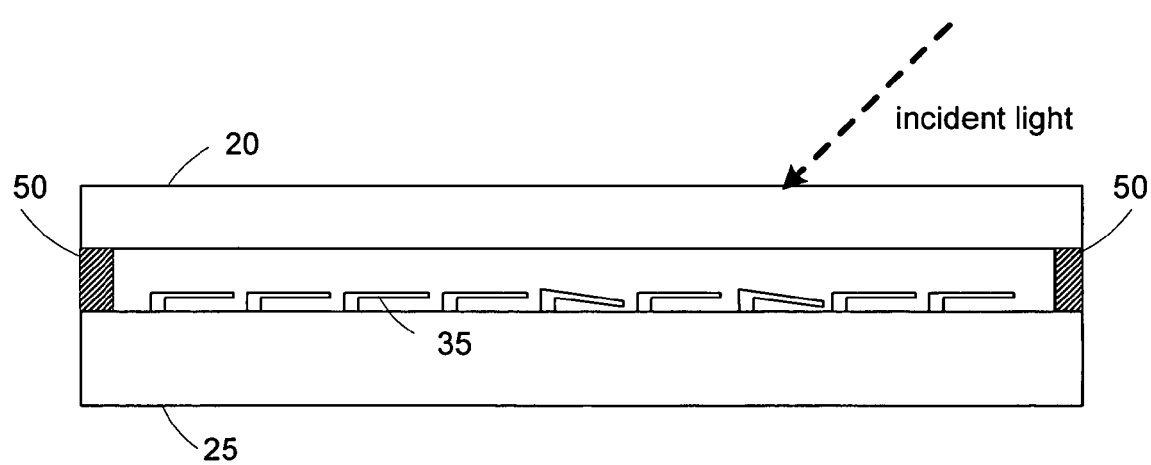
FIG. 2b is a cross-sectional view of another micromirror array device in FIG. 1.

Other than the micromirror array device described above, the micromirror array can be alternatively formed on semiconductor substrate 25, as shown in FIG. 2b. In addition to the micromirror array, semiconductor substrate 25 is formed thereon a plurality of electrodes and circuitry (not shown) underneath the micromirror array for electrostatically controlling the micromirrors. In this case, glass substrate 20 is provided for protecting the micromirror arrays. Though glass substrate 20 is preferably bonded with semiconductor substrate 25 through spacer 50 as shown in FIG. 2b, glass substrate 20 can also be placed on top of semiconductor substrate 25 without bonding.

Referring back to FIG. 1, micromirror array device 40 is attached to package substrate 30, which is a concave substrate having a cavity for accommodating micromirror array device 40. Package lid 10, which is preferably a light transmissive glass, is provided for covering and sealing the package. Because the package lid is light transmissive, it acts as a window for allowing incident light passing through and illuminating the micromirrors inside. Package lid 10 can be any suitable material, such as 1737F, quartz, Pyrex™ or sapphire. When directly covering and sealing the micromirror array device, an air gap will be formed between package lid 10 and glass substrate 20. The air gap reflects incident light and transmits only a portion of the incident light onto the micromirrors underneath. Therefore, illumination on the micromirrors is reduced.

In FIG. 1, package lid 10 is flat, and package substrate 30 is concave. This is not an absolute requirement. Rather, the package lid and the package substrate can be of any desired shape. As an example, package lid 10 can be a concave lid having a cavity for accommodating the micromirror array device, and package substrate 30 can be a flat substrate. Alternatively, the package lid and the package substrate both can be flat. In this case, a ring (not shown) may be provided between the flat package substrate and package lid for forming a cavity for the micromirror array device.

The amount of the reflected light (represented by R) from an interface between two media is proportional to the difference of the refraction indices of the two media. Specifically, $$R \propto \frac{(n_1 - n_2)^2}{(n_1 + n_2)^2},$$

wherein $n_1$ and $n_2$ are refraction indices of the two media. If an air gap is generated between package lid 10 and glass substrate 20 in FIG. 1, the incident light is reflected by the two interfaces (i.e. one interface between the air gap and package lid 10, and another interface between the air gap and glass substrate 20) of the air gap before illuminating the micromirrors. Accordingly, the total amount of reflected light, $R_{total}$, can be approximated as:

$$R_{total} \propto \frac{(n_{10} - n_{air})^2}{(n_{10} + n_{air})^2} + \frac{(n_{20} - n_{air})^2}{(n_{20} + n_{air})^2} \quad \text{(equation 1)}$$

wherein $n_{10}$, $n_{20}$ and $n_{air}$ are refraction indices of package lid, glass substrate 20 and air, respectively. As an example, assuming the refraction indices of the package lid and the glass substrate are both 1.5, and approximating the refraction index of air as 1.0, the total reflected light is estimated as 8% of the total incident light.

In order to increase the incident light flux by minimizing the reflection from the air gap, thus enhancing the illumination on the micromirrors, air in the gap is displaced with a selected optical material 15, as shown in FIG. 1. The refraction index of the optical material matches the refraction indices of package lid 10 and the glass substrate 20. Specifically, the refraction index of optical material 10, represented by $n_{15}$, substantially equals the geometrical average of the refraction indices, $n_{10}$ and $n_{20}$, of the package lid and the glass substrate. That is, $$n_{15} = \sqrt{n_{10} \times n_{20}} \quad \text{(equation 2)}$$

Alternatively, an optical material whose refraction index substantially equals the arithmetic average of $n_{10}$ and $n_{20}$ is also preferred, that is:

$$n_{15} = \frac{n_{10} + n_{20}}{2} \quad \text{(equation 3)}$$

Other suitable optical materials may also be applicable, for example an optical material whose refraction index equals $n_{10}$ or $n_{20}$. According to the embodiment of the invention, optical material 15 is a liquid or solid state material, and preferably an optical gel, such as NyoGel OC-431A-LVP, a product of Nye Optical, Inc. The refraction indices of the optical materials are preferably between 1.3 to 1.7, more preferably between 1.4 to 1.6 and more preferably around 1.5. Because the optical materials fill the space between the substrates and contact with the micromirror array device, the optical materials may flow into and thus contaminate the micromirror array device if the viscosity of the optical material is too low For this reason, the optical material selected is preferred having a viscosity between 1 poise to 10,000 poises. Because refraction indices and viscosities of optical materials depend upon temperature, it is natural to expect that the variations of the refraction index and viscosity to the temperature of the selected optical material are within the preferred ranges. It is further preferred that the selected optical materials have low evaporation rate and high thermooxidative stability. Low evaporation rate helps to avoid "dry-out" of the optical material. And the high thermooxidative stability assures high resistance to yellowing, hardening or softening of the optical material. It is still further preferred that the optical absorption (absorption per unit path length at the wavelength of incident light) of the optical material is less than 2%, more preferably, less than 1%. Optical material 15 can be other suitable optical materials, such as spin-on-glass, whale oil, or those optical materials used in optical fiber industry. In addition to the refraction requirement, it is further preferred that the selected optical material does not contaminate the inside micromirrors, especially does not affect operations of the micromirrors.

Figure 3A:
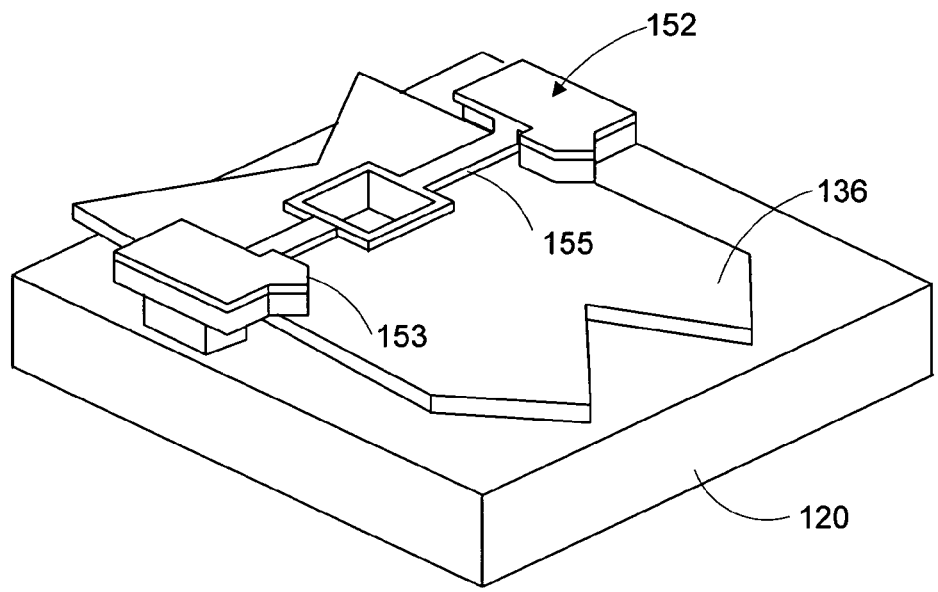
FIG. 3a is an exemplary micromirror of the micromirror array device in FIG. 1.
Figure 3B:
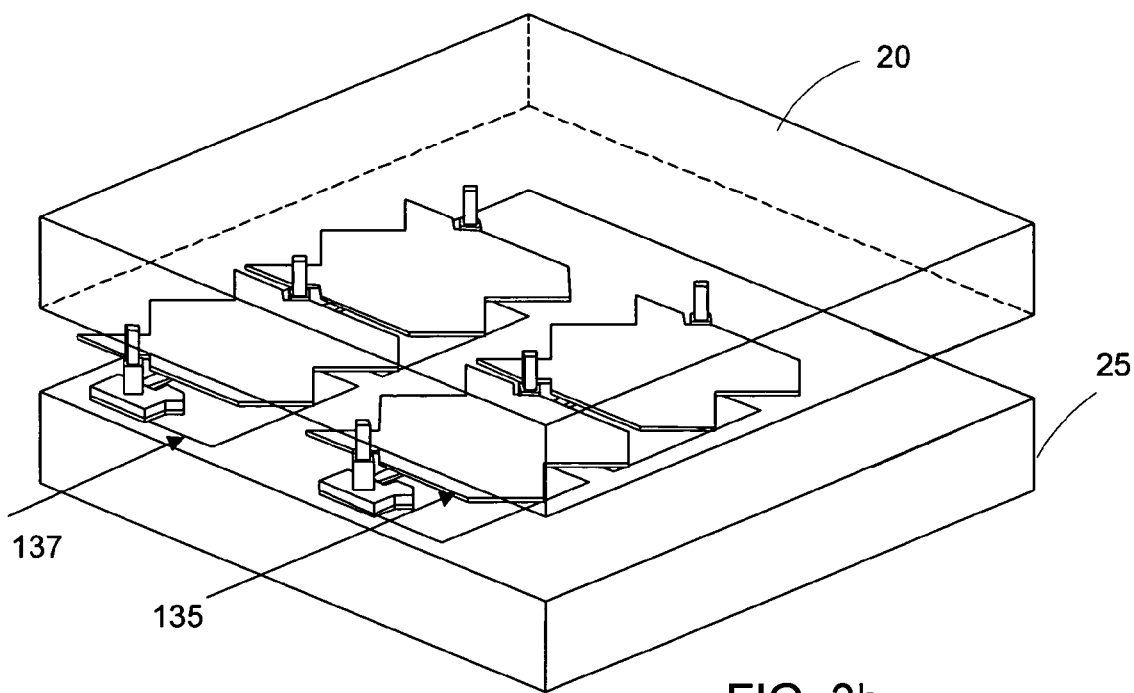
FIG. 3b is an exemplary micromirror array of FIG. 1.

There is another group of applicable optical materials for optical material 15 in FIG. 1. The refraction indices of these materials match the refraction indices of the package lid and the glass substrate of the micromirror array device so that the reflection of the incident light from the gap filled with either one of these optical materials can be minimized. For example, fluorinated spin-on-glass (with or without fluorinated solvents), fluorinated organics (e.g. Teflon-type materials) with or without fluorinated solvent(s), may also be applicable. A common characteristic of these materials (with or without solvents) is that they are fluorine containing, which may decrease outgassing. The micromirrors of micromirror array device 40 can take any suitable forms. An exemplary micromirror is schematically presented in FIG. 3*a*. Referring to FIG. 3*a*, the micromirror comprises substrate 120, micromirror plate 136, hinge 155, hinge structure 152, and other features, such as stopper 153. Micromirror plate is attached to hinge 155, which is held by hinge structure 152 that is formed on substrate 120. This configuration allows the micromirror plate rotating above substrate 120 for reflecting incident light. Substrate 120 is a glass substrate that is transparent to ultra-violet light or visible light. By repeating such micromirror within a plane, a micromirror array can be formed, as shown in FIG. 3*b*. Referring to FIG. 3*b*, micromirror array 135 comprises a number of micromirrors in FIG. 3*a*. In general, the micromirror array comprises at least half million micromirrors. The micromirror array is formed on light transmissive glass substrate 20. Semiconductor substrate 25, which comprises electrode array 137, is placed proximate to the micromirrors for electrostatically controlling the micromirrors. Each electrode is connected to a circuitry of a circuitry array (not shown) that is formed also on semiconductor substrate 25. The electrostatic states of the electrodes are controlled by the connected circuitry. A typical circuitry array is a metal-oxide-silicon (MOS) type dynamic-random-accessible memory (DRAM) array.

Figure 4A:
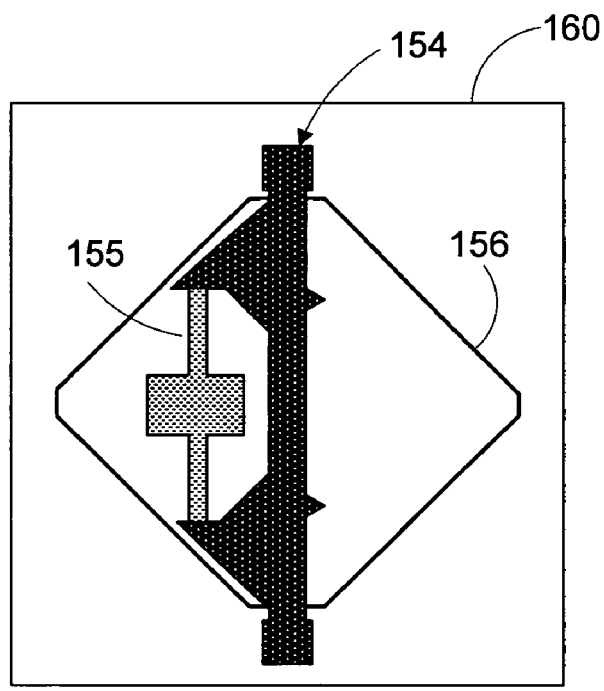
FIG. 4a is another exemplary micromirror of the micromirror array device in FIG. 1.
Figure 4B:
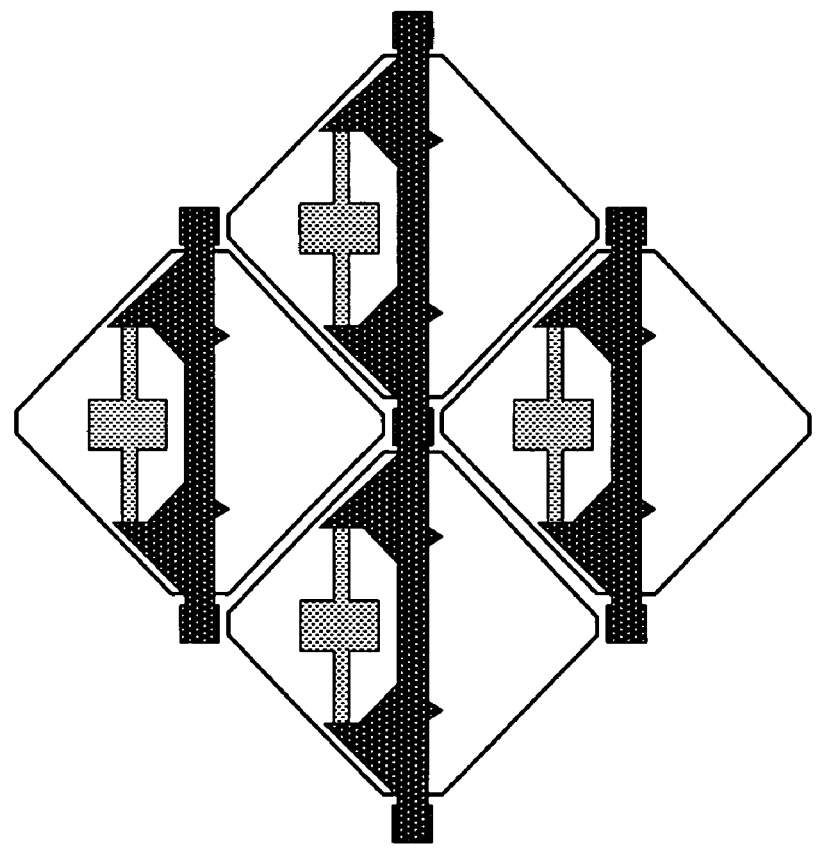
FIG. 4b is another exemplary micromirror array of FIG. 1.

Alternatively, the micromirror can be of other forms, such as that in FIG. 4*a*. Referring to FIG. 4*a*, hinge structure 154 is formed on substrate 160. Hinge 155 is held by hinge structure 154. "Diamond" shaped micromirror plate 156 is attached to hinge 155 so that micromirror plate 156 can rotate relative to and above substrate 160. FIG. 4*b* illustrates a micromirror array comprising a plurality of micromirrors of FIG. 4*a*.

Figure 5:
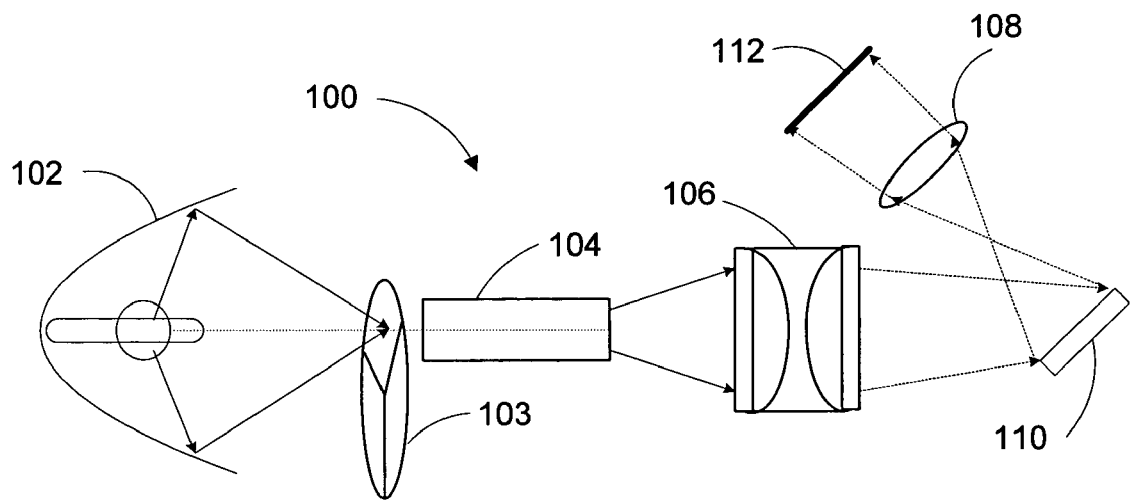
FIG. 5 is a simplified display system employing the packaged micromirror array device of FIG. 1.

Packaged micromirror array device 5 in FIG. 1 has many applications, one of which is in display systems for modulating incident light. Referring to FIG. 5, a typical display system employing a packaged micromirror array device of FIG. 1 is illustrated therein. In its very basic configuration, the display system comprises light source 102, optical devices (e.g. light pipe 104, lens 106 and 108), color wheel 103, display target 112 and spatial light modulator 110 that uses packaged micromirror array device of FIG. 5. Light source 102 (e.g. an arc lamp) directs incident light through the color wheel and optical devices (e.g. light pipe 104 and object lens 106) and shines on spatial light modulator 110. Spatial light modulator 110 selectively reflects the incident light toward optical device 108 and results in an image on display target 112. The display system can be operated in many ways, such as those set forth in U.S. Pat. No. 6,388,661, and U.S. patent application Ser. No. 10/340,162, filed on Jan. 10, 2003, both to Richards, the subject matter of each being incorporated herein by reference.

Figure 6:
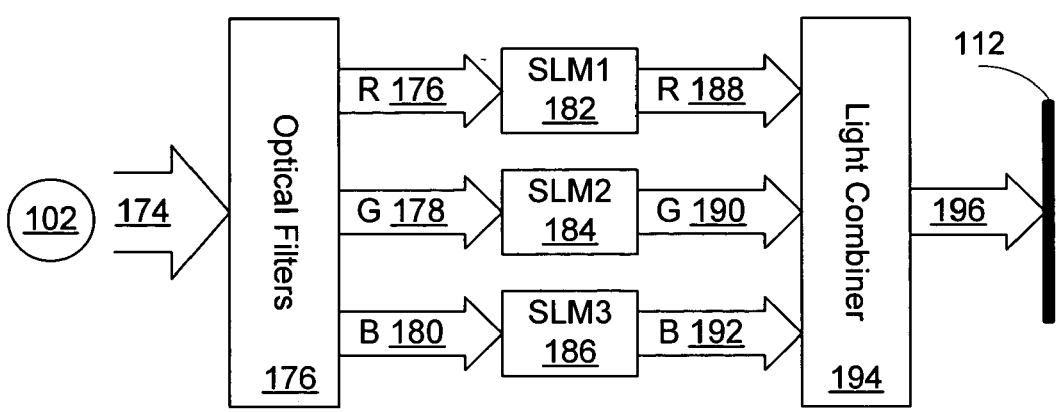
FIG. 6 is a block diagram illustrating an exemplary operation of a display system employing three packaged micromirror array devices of FIG. 1.

Referring to FIG. 6, a block diagram illustrating a display system employing three spatial light modulators, each having a packaged micromirror array device of FIG. 1, is shown, wherein each spatial light modulator is designated for respectively modulating the three primary color (i.e. red, green and blue) light beams. As shown, light 174 from light source 102 passes through optical filters 176 and is split into three primary color light beams, that is, red light 176, green light 178 and blue light 180. Each color light beam impinges a separate spatial light modulator and is modulated thereby. Specifically, red light 176, green light 178 and blue light 180 respectively impinge spatial light modulators 182, 184 and 186 and are modulated. The modulated red light 188, green light 190 and blue light 192 are recombined at light combiner 194 for forming modulated color images. Combined color light 196 is directed (e.g. by projection lens) onto display target 112 for viewing. A simplified display system based on the block diagram of FIG. 5 is presented in FIG. 7.

Figure 7:
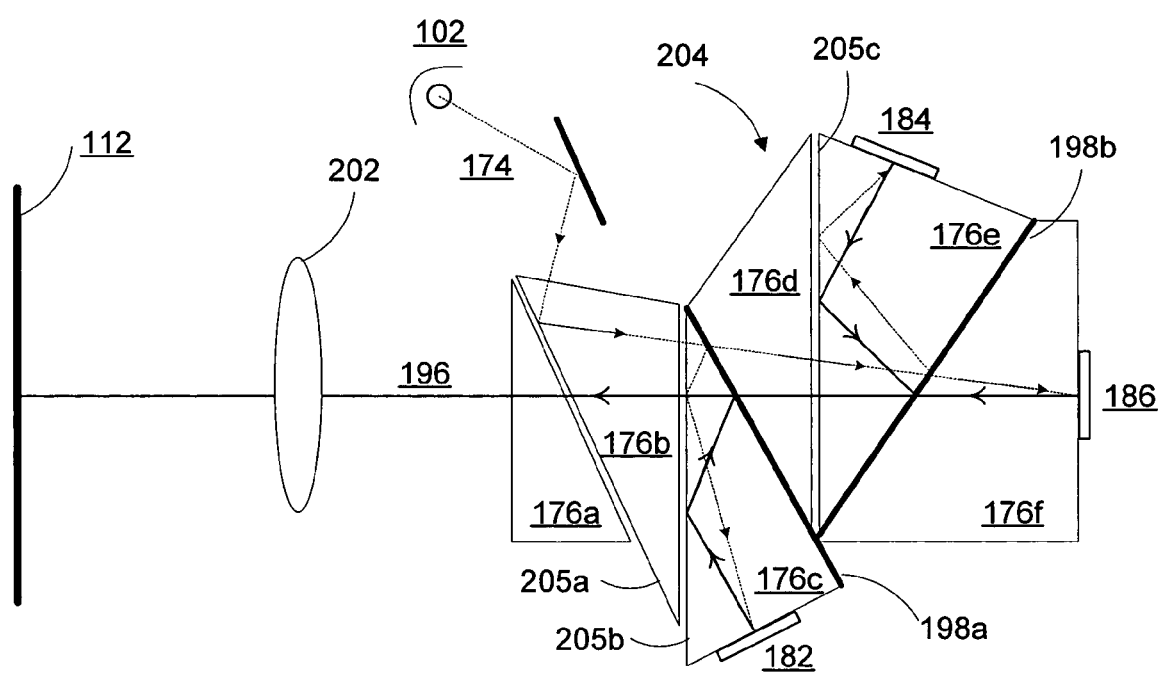
FIG. 7 is a diagram schematically illustrating a display system employing three packaged micromirror array devices of FIG. 1.

Referring to FIG. 7, the display system employs a dichroic prism assembly 204 for splitting incident light into three primary color light beams. Dichroic prism assembly comprises prisms 176*a*, 176*b*, 176*c*, 176*d*, 176*e* and 176*f*. Totally-internally-reflection (TIR) surfaces, i.e. TIR surfaces 205*a*, 205*b* and 205*c*, are defined at the prism surfaces that face air gaps. The surfaces 198*a* and 198*b* prisms 176*c* and 176*e* are coated with dichroic films, yielding dichroic surfaces. In particular, dichroic surface 198*a* reflects green light and transmits other light. Dichroic surface 198*b* reflects red light and transmits other light. The three spatial light modulators, 182, 184 and 186 are arranged around the prism assembly. Each spatial light modulator comprises a packaged micromirror array device of FIG. 1 for modulating incident light.

Regardless of whether the optical system utilizes a single micromirror array as in FIG. 5, or multiple micromirror arrays as in FIG. 7, reflection from light transmissive substrates is preferably minimized. In operation, incident white light 174 from light source 102 enters into prism 176*b* and is directed towards TIR surface 205*a* at an angle larger than the critical TIR angle of TIR surface 205*a*. TIR surface 205*a* totally internally reflects the incident white light towards spatial light modulator 186, which is designated for modulating the blue light component of the incident white light. At the dichroic surface 198*a*, the green light component of the totally internally reflected light from TIR surface 205*a* is separated therefrom and reflected towards spatial light modulator 182, which is designated for modulating green light. As seen, the separated green light may experience TIR by TIR surface 205*b* in order to illuminate spatial light modulator 182 at a desired angle. This can be accomplished by arranging the incident angle of the separated green light onto TIR surface 205*b* larger than the critical TIR angle of TIR surface 205*b*. The rest of the light components, other than the green light, of the reflected light from the TIR surface 205*a* pass through dichroic surface 198*a* and are reflected at dichroic surface 198*b*. Because dichroic surface 198*b* is designated for reflecting red light component, the red light component of the incident light onto dichroic surface 198*b* is thus separated and reflected onto spatial light modulator 184, which is designated for modulating red light. Finally, the blue component of the white incident light (white light 174) reaches spatial light modulator 186 and is modulated thereby. By collaborating operations of the three spatial light modulators, red, green and blue lights can be properly modulated. The modulated red, green and blue lights are recollected and delivered onto display target 112 through optic elements, such as projection lens 202, if necessary.

In the above description, package substrate 30 in FIG. 1 is a concave substrate having a cavity for accommodating micromirror array device 40. Alternatively, package substrate 40 in FIG. 1 can take any desired shape for accommodating the micromirror array device. In particular, the package substrate can be a flat substrate, on which the micromirror array device can be attached. In this case, a spacer (not shown in FIG. 1) may be provided between package substrate 30 (in FIG. 1) and package lid 10 (in FIG. 1) for generating a space for accommodating micromirror array device 40.

The micromirrors and the micromirror array devices shown in FIGS. 2*a* and 2*b* can be fabricated in a variety methods, such as those set forth in U.S. Pat. Nos. 5,835,256 and 6,046,840 both to Huibers, and U.S. patent application Ser. No. 10/366,297 filed on Feb. 12, 2003 to Patel, the subject matter of each being incorporated herein by reference.

It will be appreciated by those of skill in the art that a new and useful method for packaging micromirror array devices has been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. In particular, other protective materials, such as inert gas, may be filled in the space formed by the package substrate and the package lid. Therefore, the invention as described herein contemplates all such embodiments as may come within the scope of the following claims and equivalents thereof.

I claim:

1. A device, comprising:
   a package with a first substrate that is transmissive to ultra-violet or visible light;
   a micromirror array device placed within the package, wherein the micromirror array device further comprises a second substrate that is transmissive to visible light; and
   a light-transmissive optical material that fills the space between and in contact with the first and second substrates, wherein the optical material is in liquid or solid state.

2. The device of claim 1, wherein the package further comprises: a packaging substrate.

3. The device of claim 2, wherein the packaging substrate is a concave substrate having a cavity, in which the micromirror array device is disposed; and wherein the opening of the concave substrate is covered and sealed by the package lid.

4. The device of claim 2, wherein the packaging substrate is a ceramic.

5. The device of claim 2, wherein the packaging substrate is glass.

6. The device of claim 1, wherein the first substrate is glass.

7. The device of claim 1, wherein the micromirror array device comprises a number of micromirrors; and wherein the number of the micromirrors is at least half million.

8. The device of claim 7, wherein the micromirrors are formed on the glass substrate of the micromirror array device.

9. The method of claim 7, wherein each micromirror is associated with an electrode of an electrode array so that the micromirror is controlled electrostatically by the electrode, each electrode being connected to a circuitry of a circuitry array so that the electrostatic state of the electrode is controlled by the circuitry; and wherein the circuitry array and the electrode array are formed on a semiconductor substrate that is placed proximate to the glass substrate.

10. The method of claim 7, wherein the micromirrors are formed on a semiconductor substrate that further comprises an electrode array and a circuitry array for electrostatically controlling the micromirrors of the micromirror array; and wherein the semiconductor substrate and the package lid are placed on separate sides of the glass substrate of the micromirror array device.

11. The method of claim 1, wherein the optical material is an optical gel.

12. The method of claim 11, wherein the refraction index of the optical gel to the visible light is substantially the geometrical average of the refraction indices of the package lid and the glass substrate of the micromirror array device to the visible light.

13. The method of claim 11, wherein the refraction index of the optical gel to the visible light is substantially the arithmetic average of the refraction indices of the package lid and the glass substrate of the micromirror array device to the visible light.

14. The method of claim 11, wherein the refraction index of the optical gel to the visible light is from 1.3 to 1.7.

15. A method, comprising:
   providing a micromirror array device that comprises a glass substrate and a number of micromirrors;
   attaching the micromirror array device to a packaging substrate of a package;
   providing a packaging lid;
   filling a light-transmissive optical material in the space between the glass substrate of the micromirror array device and the packaging lid, wherein the optical material is in liquid or solid state; and
   bonding the packaging lid and the packaging substrate.

16. The method of claim 15, wherein the number of micromirrors of the micromirror array device is at least one million.

17. The method of claim 15, wherein the micromirrors are formed on the glass substrate; and wherein the micromirrors being electrostatically controlled by an array of electrode, the electrode and circuitry array being formed on a semiconductor substrate that is placed proximate to the glass substrate of the micromirror array device.

18. The method of claim 15, wherein the micromirrors are formed on a semiconductor substrate that further comprises an array of electrodes and circuitry for electrostatically controlling the micromirrors; and wherein the semiconductor substrate and the packaging lid are placed on separate sides of the glass substrate of the micromirror array device.

19. The method of claim 15, wherein the packaging substrate is a concave substrate that has a cavity, in which the micromirror array device is attached.

20. The method of claim 15, wherein the packaging substrate is a ceramic.

21. The method of claim 15, wherein the packaging substrate is glass.

22. The method of claim 15, wherein the optical material is an optical gel.

23. The method of claim 22, wherein the refraction index of the optical gel to the visible light is substantially the geometrical average of the refraction indices of the glass substrate of the micromirror array device and the packaging lid to the visible light.

24. The method of claim 22, wherein the refraction index of the optical gel to the visible light is substantially the arithmetic average of the refraction indices of the glass substrate of the micromirror array device and the packaging lid to the visible light.

25. The method of claim 22, wherein the refraction index of the optical gel is from 1.3 to 1.7.

* * * * *